United States Patent [19]

Jäntsch et al.

[11] 4,231,810
[45] Nov. 4, 1980

[54] PROCESS FOR PRODUCING BI-POLAR CHARGE COUPLED DEVICES BY ION-IMPLANTATION

[75] Inventors: Ottomar Jäntsch, Ottobrunn; Jenö Tihanyi, Munich, both of, Fed. Rep. of Germany

[73] Assignee: Siemens Aktiengesellschaft, Berlin & Munich, Fed. Rep. of Germany

[21] Appl. No.: 65,960

[22] Filed: Aug. 13, 1979

[30] Foreign Application Priority Data

Aug. 28, 1978 [DE] Fed. Rep. of Germany ....... 2837485

[51] Int. Cl.³ .................... H01L 29/78; H01L 21/265
[52] U.S. Cl. .................................... 148/1.5; 148/187; 357/24; 7/91
[58] Field of Search ............... 148/1.5, 187; 357/24, 357/91

[56] References Cited

U.S. PATENT DOCUMENTS

| 3,739,240 | 6/1973 | Krambeck | 317/235 R |
|---|---|---|---|
| 3,930,893 | 1/1976 | Tschon | 148/1.5 |
| 4,024,563 | 5/1977 | Tasch, Jr. | 357/24 |
| 4,032,952 | 6/1977 | Ohba et al. | 357/24 |
| 4,047,215 | 9/1977 | Frye et al. | 357/24 |

OTHER PUBLICATIONS

Boyle et al., Bell Syst. Techn. J. 49, (1970), 587.
Kleefstra, Micro-Electronics, vol. 7, No. 2, (1975) 68.

Primary Examiner—L. Dewayne Rutledge
Assistant Examiner—Upendra Roy
Attorney, Agent, or Firm—Hill, Van Santen, Steadman, Chiara & Simpson

[57] ABSTRACT

A charge coupled device (CCD-device) for sensors and memory is produced so as to have a bipolar structure, with the doped regions and zones thereof being produced by ion implantation whereby a greater structure density is attained along with a reduction in the transfer coefficient $\epsilon$.

8 Claims, 21 Drawing Figures

PROCESS FOR PRODUCING BI-POLAR CHARGE COUPLED DEVICES BY ION-IMPLANTATION

BACKGROUND OF THE INVENTION

1. Field of the Invention

The invention relates to a process of producing electrical devices and more particularly to a process of producing charge coupled devices for sensors and memories.

2. Prior Art

Charged coupled devices (sometimes referred to as CCD-arrangements or CCD-devices) for sensors and memory are known. For example, W. S. Boyle et al in Bell Syst. Techn. J., pages 587–593 (April 1970) disclose a CCD device of this type which generally consist of a semiconductor body having an electrically insulating layer applied thereon, with metal electrodes. Such metal electrodes are separated from one another by spacings. The operative principle of such CCDs is to store minority charge carriers by connecting a voltage to a metal electrode on the surface of the semiconductor and to shift these minority charge carriers from one electrode to the next electrode by connecting appropriate voltages. Arrangements of this type are useful in constructing particularly good shift registers.

M. Kleefstra, "First Experimental Bi-Polar Charge-Coupled Devices", Microelectronics, Vol. 7, No. 2, pages 68–69, (1975), Mackintosh Publications Ltd., Luton, suggests a CDD wherein a n-silicon trough containing a shift channel of the CCD is arranged in a p-silicon substrate. Such trough contains p-doped zones which are separate from one another, with a control electrode arranged in each case above a gap between two p-doped zones and above portions of the p-doped zones adjoin such gap. An $n^+$-doped region is provided in the n-silicon trough at each end of the shift channel, which is composed of the p-doped zones. By connecting a positive potential, which is sufficiently high relative to the p-doped zones, to the n-doped regions, it is possible to reduce the charge carriers in that part of the n-silicon trough located between the p-doped zones. This arrangement electrically connects the control electrodes and the p-silicon substrate. At this juncture, the channel no longer contains any moving charge carriers. The positive space charge in the channel is compensated by the negative space charge in the p-doped zones. Assuming that no noticeable vertical or lateral current is flowing between the p-doped zones and that no breakthrough voltage occurs, it is possible to change the channel potential by varying the potential across the control electrodes. By connecting modulating pulses to the control electrodes it is possible to sufficiently reduce the potential between adjacent control electrodes so as to enable charge transport to take place. With a homogeneous doping of the n-silicon trough, potential walls which weaken the charge transport can be formed between the control electrodes.

SUMMARY OF THE INVENTION

The invention provides a method of producing a CCD device of the above type wherein the potential walls which form between the control electrodes are reduced or eliminated.

In accordance with the principles of the invention a CCD is produced so as to have a bi-polar structure, with the doped regions and zones thereof being produced by ion implantation. In this manner, the process of producing such CCD is substantially more simpler and economical in comparison the prior art processes, and is more reproducible.

In accordance with the principles of the invention, a CCD is produced by providing a semiconductor substrate of a first conductivity type, producing regions of a second conductivity type in the semiconductor substrate so as to form a shift channel via ion implantation, producing zones of said first conductivity type is said regions via ion implantation, with such regions and zones being arranged in series, with each region being separated from other regions and each zone being separated from other zones, producing control electrodes above an interspace between said zones and above portions of said zone which adjoin the interspace and producing a relatively highly doped region of the second conductivity type at each end of the shift channel via ion implantation.

DESCRIPTION OF THE PREFERRED EMBODIMENTS

Figure 1:
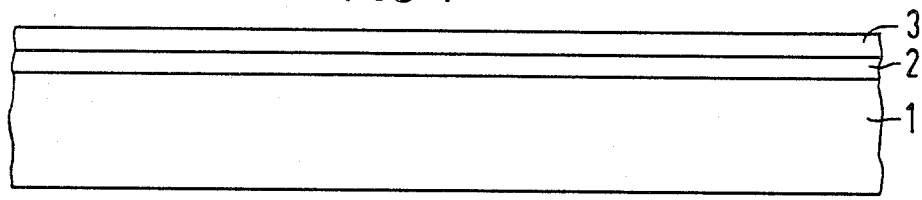
FIGS. 1–14 somewhat schematically illustrate the individual process steps of the invention utilized in the production of an implanted bipolar CCD.

A p-doped silicon substrate 1 of about 140 $\Omega$.cm is illustrated at FIG. 1. A first electrically insulating layer 2, preferably a $SiO_2$ layer, is applied to the substrate 1 in a known manner. The thickness of such $SiO_2$ layer is, for example, about 100 nm. A first photo-lacquer layer 3 is applied onto the first insulating layer 2 in order to facilitate production of openings or windows therein in a conventional photolithorgraphic process.

Figure 2:
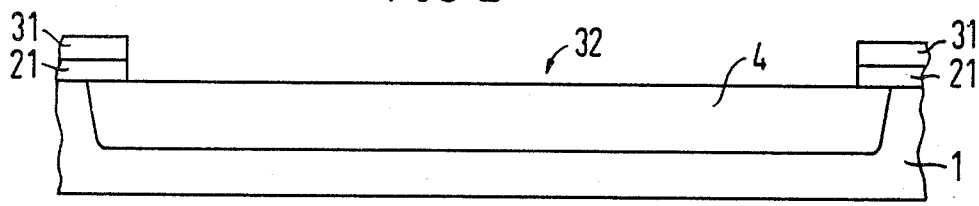

FIG. 2 illustrates an exemplary opening or window 32 provided through portions of layers 2 and 3. During the production of such a window, a select portion of the photo-lacquer layer 3 is removed via conventional photolithorgraphic process steps and the portion of the insulating layer 2 located beneath the removed photo-lacquer layer is preferably removed by means of wet-chemical etching step so as to form the window 32.

In FIG. 2, those portions of layers 2 and 3 which have not been removed by the above described process steps are referenced by numerals 21 and 31 respectively. Employing an implantation process, a trough 4, which is doped oppositely to the substrate 1, is then produced through the window 32 in the manner shown at FIG. 2. In an exemplary embodiment, phosphorus is preferably introduced into the region or trough 4 via an ion implantation step. The energy utilized for such ion implantation is, for example, 300 KV with a maximum penetration depth of about 3800 angstroms. The dopant dose is, for example, $8 \times 10^{12}$ ions $cm^{-2}$ (which corresponds to $8 \times 10^{17}$ ions $cm^{-3}$ max. or approximately $10^{15}$ ions $cm^{-3}$ at the boundary surface).

Figure 3:
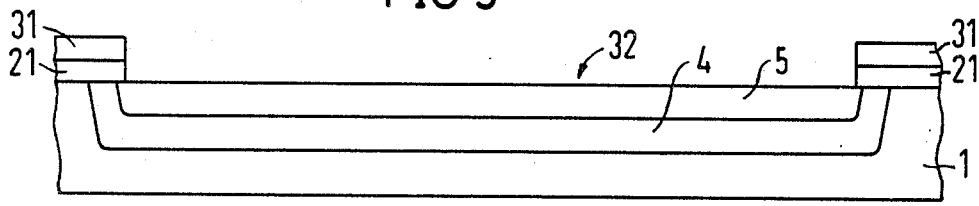

As a further process step, illustrated at FIG. 3, boron ions are preferably implanted into the same opening or window 32 using an ion implantation step so as to form a region 5 which possesses the same conductivity as the substrate 1. Preferably, the boron implantation is carried out with an energy of about 35 KV and in a dose of about $10^{11}$ ions $cm^{-2}$ (which corresponds to $10^{16}$ ions $cm^{-3}$ at the boundary surface). In this manner, a region 5 is formed within the trough 4 and is of the opposite conductivity type to that of trough 4.

Figure 4:
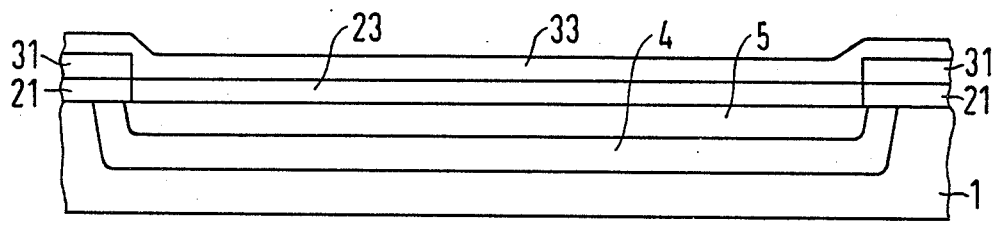

As a further process step, illustrated at FIG. 4, a second electrically insulating SiO$_2$ layer 23 is applied so as to cover the window, preferably by thermal oxidation. Thereafter a second photo-lacquer layer 33 is applied over the entire arrangement, as shown at FIG. 4.

Figure 5:
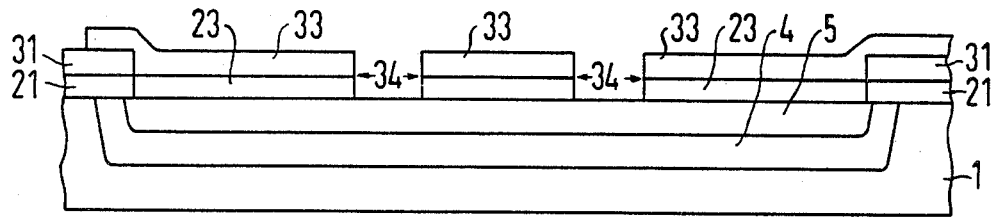

Additional openings or windows are produced in the photo-lacquer layer 33 by means of conventional photolithographic processes and portions of the second insulating layer 23 located beneath such openings are, preferably, removed by means of a wet-chemical etching step so as to produce windows 34, which extend through layers 23 and 33 as shown in FIG. 5.

A polysilicon layer 6 is then deposited (FIG. 6) and is preferably doped with boron. A photo-lacquer layer 7 is then applied photolithographically onto the polysilicon layer 6. Openings or windows 71 are produced through the lacquer layer and the polysilicon layer as explanned above. Secondary contacts of the CCD arrangement are produced in this manner by partially removing the polysilicon layer 6. This arrangement is illustrated at FIG. 6.

Figure 6:
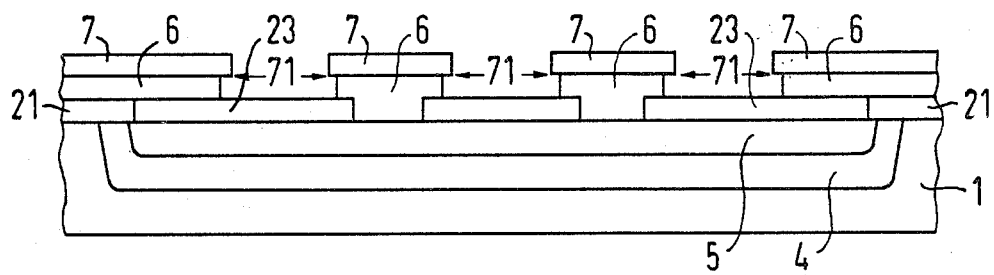
Figure 7:
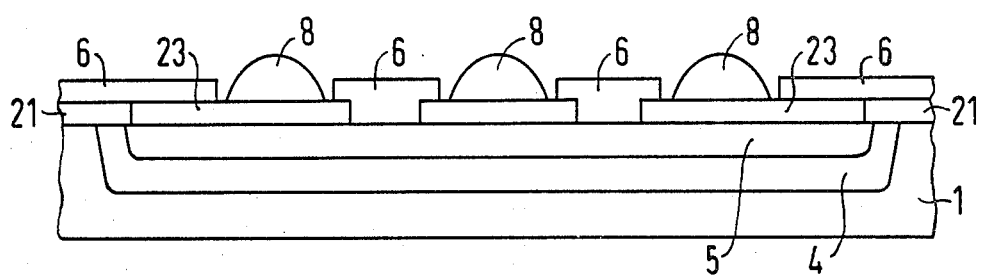
Figure 8:
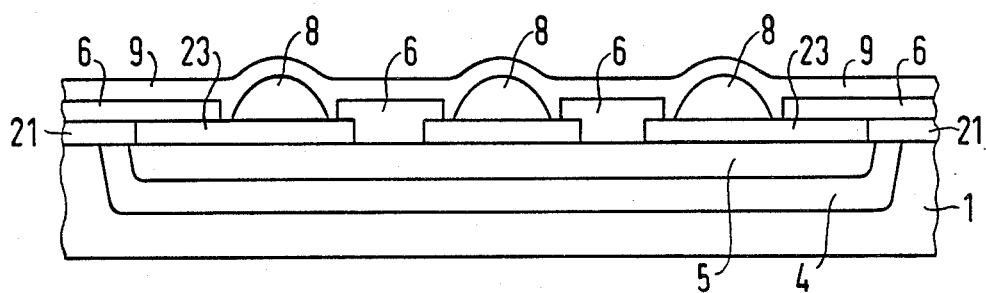
Figure 9:
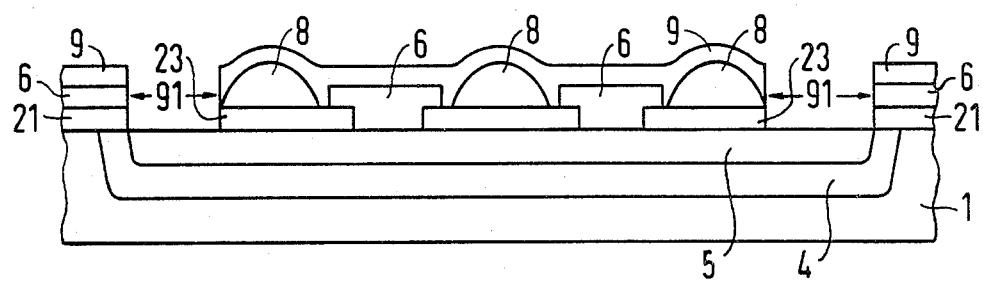
Figure 10:
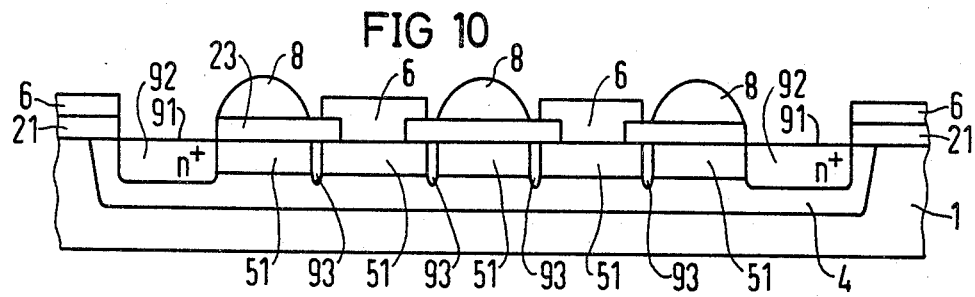

In a further process step, an aluminium layer (not shown in detail in the drawings) is vapour deposited on the arrangement shown at FIG. 6. The photo-lacquer layer 7 (of FIG. 6) and the aluminium applied thereabove are removed via the so-called lifting technique. In the so-attained arrangement is illustrated at FIG. 6 wherein aluminium humps 8 remain in the openings or windows 71 (best seen at FIG. 6). In a further process step, an additional photo-sensitive lacquer layer 9 is applied over the entire arrangement shown in FIG. 7. Further openings are then produced in the photo-sensitive lacquer layer 9, as shown at FIG. 9. Portions of the layers 6 and 21 located beneath the openings in layer 9 are, removed preferably via a wet-chemical etching step. This process forms openings or windows 91 which uncover portions of the surface of trough 5, as shown at FIG. 9.

A third ion implantation step is illustrated at FIG. 9 whereby, preferably, phosphorus ions are implanted into regions 92 located beneath the windows or openings 91. Substantially simultaneously during this ion implantation step, the gaps adjacent the aluminium humps 8 not covered by the polysilicon layer 6 are subjected to an ion implantation, preferably with phosphorus, so as to form regions 93. Regions 92 and 93 extend further into the substrate 1 than the region 5, view from the surface. In this manner, p-doped sub-regions 51 are produced in region 5 which are electrically insulated from one another by regions 93. The regions 92 and 93 are preferably n+-doped. During the third ion implantation step, phosphorus is introduced with an energy of about 100 KV into the openings or windows 91 and into the areas between the aluminium humps 8 and the polysilicon layer 6. The dose utilized in the third ion implantation step preferably is about $8 \times 10^{12}$ cm$^{-2}$ (this corresponds to approximately $8 \times 10^{17}$ ions cm$^{-3}$ at the boundary surface).

Figure 11:
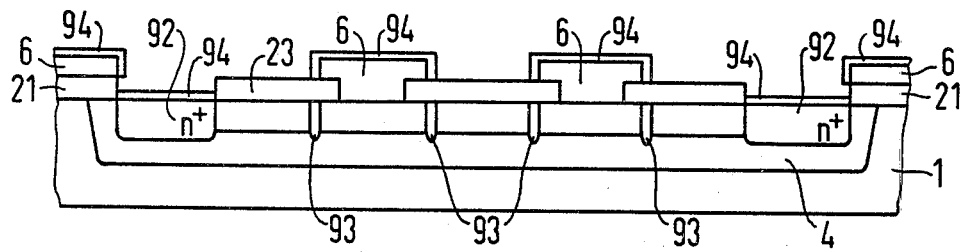

As can be seen from FIG. 11, the aluminium humps are then removed and the exposed polysilicon areas 6, along with the exposed silicon surface 91 are oxidized using an oxidation process so that insulating oxidation regions 94 are formed on the polysilicon regions 6 in the manner shown at FIG. 11.

Next, openings or windows 911 are produced in the oxidation regions 94 so as to provide a contact to the n+-doped regions 92. Substantially simultaneously or in a subsequent processing step, those portions 23 of the original oxidation layer 2 which are located above the sub-regions 51 of region 5 are provided with windows or openings 231 so as to contact the sub-region 51 (FIG. 12).

Figure 12:
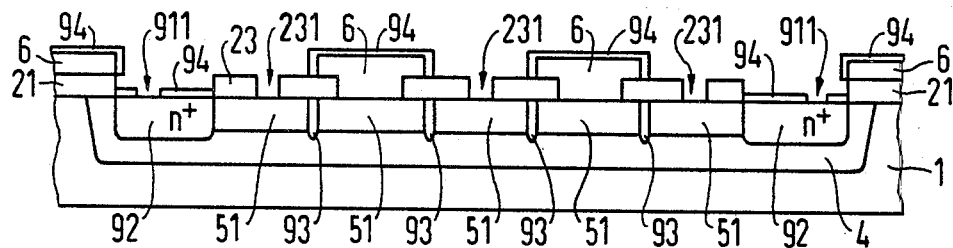
Figure 13:
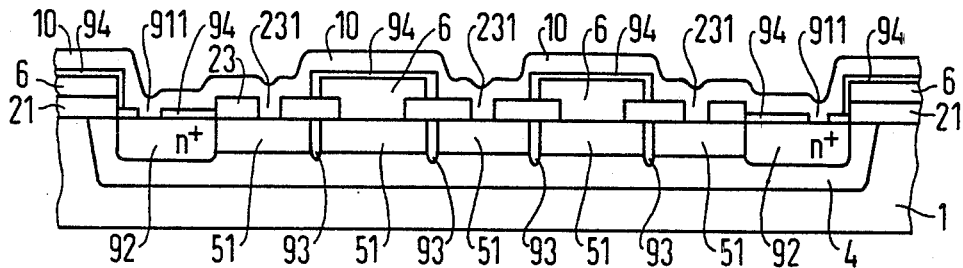

Next, as illustrated in FIG. 13, a metal layer 10, which is preferably a vapour deposited aluminium layer, is applied to the arrangement shown at FIG. 12.

Figure 14:
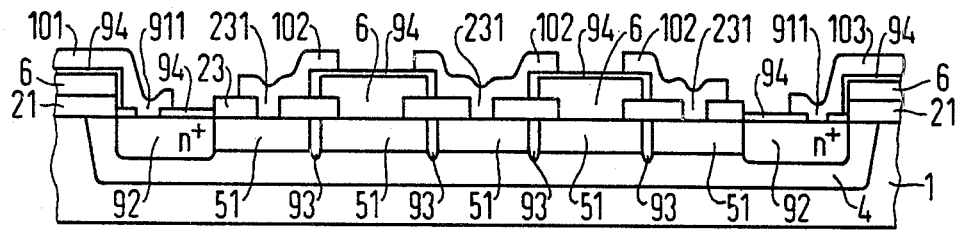

Preferably using a photolithographic process, the continuous aluminium layer 10 of FIG. 13 is interrupted so as to form a plurality of electrodes 101, 102 and 103 as illustrated in FIG. 14. Electrode 101 is connected to the n+-doped region 92, electrode 102 is connected to the sub-region 51 of region 5 and the electrode 103 is electrically connected to the n+-doped region 92.

The structure illustrated at FIG. 14 is a bipolar CCD which has been produced in accordance with the principles of the invention and exhibits advantages in comparison with the structure disclosed in the earlier-referenced Microelectronics Publication. More, specifically, the above described sequence of processing steps facilitates making the end-conducting regions 93, which separate the p-conducting gate regions 51, narrower by a factor of approximately 5 than is possible with the known arrangement disclosed in the earlier-referenced Microelectronics Publication. This results in a reduction in the losses which occur during a charge transfer from one gate to another, i.e., the transfer coefficient $\epsilon$ is reduced by following the principles of the invention.

In an alternative embodiment of the invention, the steps illustrated in FIGS. 1-5 described above are likewise utilized. In this embodiment, a substrate 1, which preferably comprises a p-silicon material, is initially provided with an oxide layer 2, preferably a SiO$_2$ layer and then coated with a photo-sensitive lacquer layer 3. Thereafter, openings or windows are formed as explained earlier. Then, in accordance with the step illustrated at FIG. 3, two ion implantation steps are undertaken to produce regions 4 and 5. Then, in accordance with the process step illustrated at FIG. 4, an oxide layer 23 is applied in openings or windows 32 and a photo-sensitive lacquer layer 33 is applied over the entire arrangement. In accordance with the step illustrated at FIG. 5, the openings or windows 34 are produced via a photolithographic process combined with a wet-chemical etching step as explained earlier.

Figure 15:
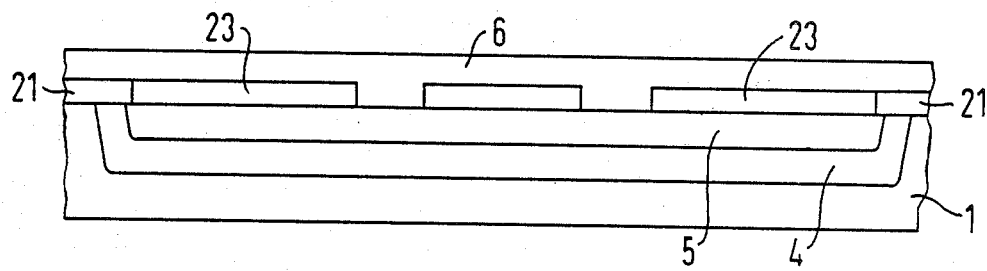
FIGS. 15–21 somewhat schematically illustrate the individual process steps of another embodiment of the invention for producing an implanted bipolar CCD.

Next, as illustrated at FIG. 15, a polysilicon layer 6, which is preferably doped with boron, is applied over the entire arrangement.

Figure 16:
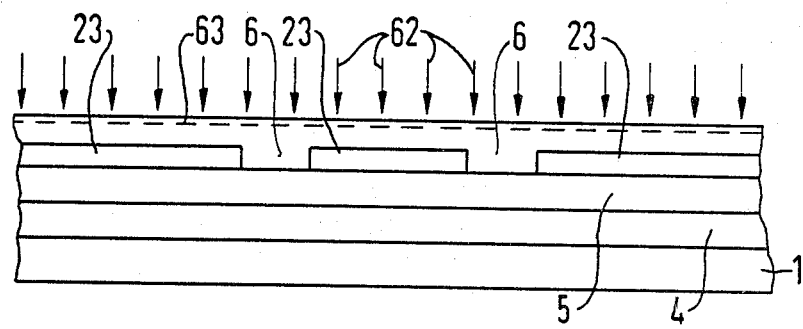

As a next sequential step, illustrated at FIG. 16, a "damage" layer 63 is produced in the polysilicon layer 6. In order to accomplish this, the surface of the polysilicon layer 6 is bombarded with particles 62 for a relatively short length of time. This functions to disturb the structure of the polysilicon layer 6 and produce a disturbed or "damage" layer 63. The purpose of this disturbed layer 63 is to form sloped openings or windows in the polysilicon layer 6 during a subsequence etching step, preferably a wet-chemical etching step. Such sloped openings or windows occur because a higher etching rate is achieved in the disturbed layer 63 than for the remainder of the polysilicon layer 6 into which no particles 62 have penetrated. As exemplary conditions for achieving a disturbed layer, the polysilicon layer 6 can be bombarded with accelerated particles of approximately 0.5 to 1 KV in dose of about $10^{\neq}$ particles cm$^{-2}$. Preferably, such particles comprise arsenic ions. Further details regarding this procedure for the production of sloped openings or windows in a polysilicon layer may be gathered from German OS No. 25 54 638.

Figure 17:
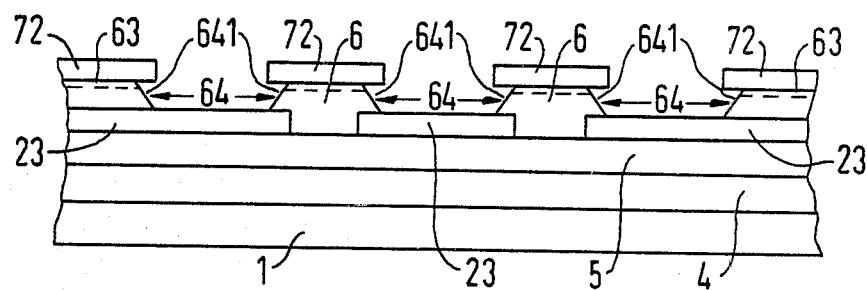

As a next sequential processing step, illustrated at FIG. 17, a photo-sensitive lacquer layer 17 is applied over the arrangement illustrated at FIG. 16. A photolithographic process is then utilized to expose and develop the photo-lacquer layer and produce openings therein. Preferably, using a wet-chemical etching step, those parts of the polysilicon layer 6 which are located beneath these openings or windows are removed together with portions of the damage layer 63. The openings or windows 64 having slopes 641 are produced in this manner.

Figure 18:
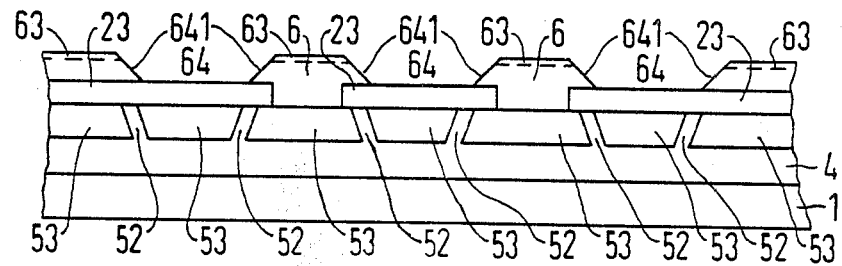

In the next sequential step, illustrated at FIG. 18, the remaining portions of the photo-sensitive lacquer layer 72 (FIG. 17) are removed and phosphorus is implanted into the arrangement shown at FIG. 18 with an energy of about 300 KV and in a dose of about $8 \times 10^{12}$ ions cm$^{-2}$ (corresponding to about $8 \times 10^{17}$ ions cm$^{-3}$). In this manner, regions 52, which are oppositely doped to the regions 53, are formed within region 5. The regions 52 can be reached because the implantation step utilized in forming them is a deep implantation step. This means that the distribution maximum of the implanted ions is, on the one hand, such that no ions can pass through the polycrystalline silicon layer 6 into the p-doped region 5 located beneath the polycrystalline layer 6 and, on the other hand, is such that ions which pass through the openings or windows 64 and the underlying SiO$_2$ layer 23 can penetrate sufficiently deep into the region 4 to ensure that the sub-zone of the p-region which lies beneath the windows is fundamentally retained. Because of the oblique slopes on the remaining portions of the polycrystalline silicon layer 6, the n-doped regions 52 which electrically isolate the individual p-regions 53 from one another, are then formed in the p-region 5. An exemplary deep phosphorus ion implantation comprises implanting phosphorus ions with an energy of about 300 KV and in a dose of about $8 \times 10^{12}$ ions cm$^{-2}$ (which is approximately equal to $8 \times 10^{17}$ ions cm$^{-3}$).

Figure 19:
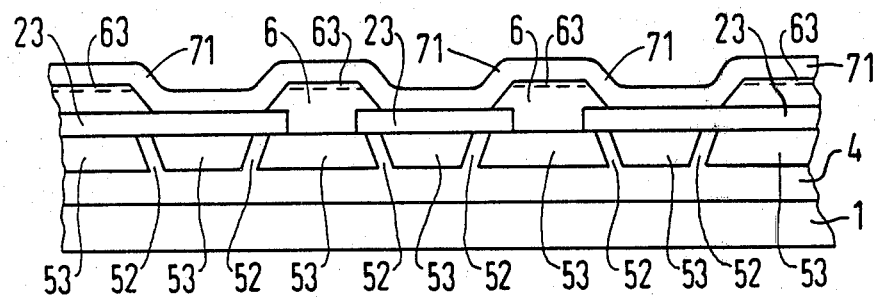

As a next sequential step, illustrated at FIG. 19, an oxidation layer 71 is then deposited over the entire arrangement, for example via a thermal oxidation process.

Figure 20:
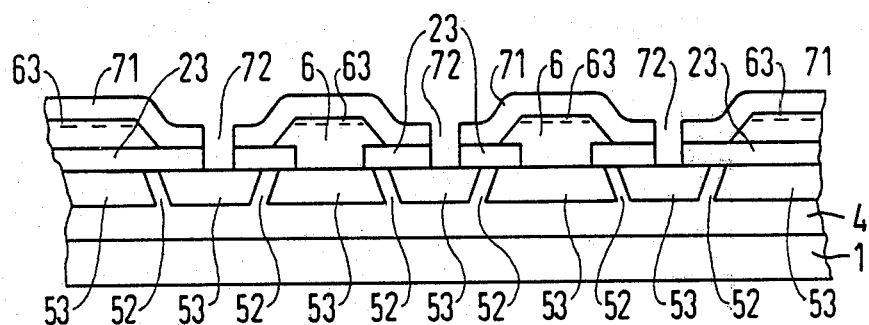

Next, utilizing a photolithographic process step and a wet-chemical etching step, the openings or windows 72 are formed in layer 71 and the underlying portions of layer 23, as illustrated at FIG. 20.

Finally an electrically conductive strip, which preferably is composed of polysilicon, is applied to the arrangement shown at FIG. 20. Pulse train electrodes 73 are then formed on this strip for the second regions 53, as shown at FIG. 21.

Figure 21:
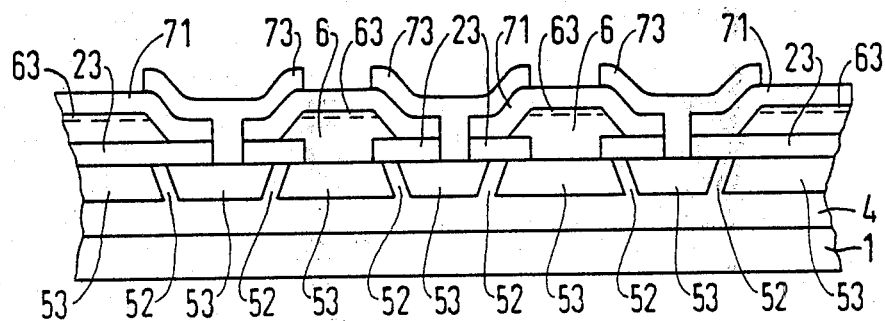

Finally, the structure illustrated at FIG. 21 is preferably provided with a protective oxide coating (not shown in the drawings). In comparing the resultant structure shown at FIG. 21 with that described at FIG. 14, the present structure is advantageous in that regions 52, which separate the gate electrodes 53, can be made narrower then regions 93 of FIG. 14. Accordingly, the device shown at FIG. 21 possesses a lower transfer coefficient $\epsilon$ than the device shown at FIG. 14.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

We claim as our invention:

1. A process for producing a charge coupled device for sensors and memories comprising:
   (a) providing a semiconductor substrate of a first conductivity type;
   (b) producing regions of a second conductivity type in said semiconductor substrate via ion implantation so as to form a shift channel;
   (c) producing zones of said first conductivity type in said regions via ion implantation;
   said regions and zones being arranged in series, with each region being separated from other regions and each zone being separated from other zones;
   (d) producing a control electrode between an interspace between said zones and above portions of said zones which are adjoin said interspace; and
   (e) producing a relatively highly doped region of said second conductivity type at each end of said shift channel via ion implantation.

2. A process as defined in claim 1 wherein said semiconductor substrate comprises a p-doped silicon and said second conductivity type regions are comprised of n-doped silicon.

3. A process as defined in claim 1 wherein said substrate consists of a p-conducting silicon having a carrier concentration of about $10^{14}$ cm$^{-3}$.

4. A process for producing a charge coupled device for sensors and memories comprising the sequential steps:
   (a) applying a first insulating layer in a thickness of about 100 nm to a p-conducting silicon substrate;
   (b) producing first windows in the insulating layer via a photo-lacquer technique;
   (c) implanting n-doping ions in said first window with a kinetic energy of about 300 KV and in a implantation dose of about $8 \times 10^{12}$ ions cm$^{-2}$;
   (d) implanting p-doping ions in said first window with a kinetic energy of about 35 KV and in an implantation dose of about $10^{11}$ ions cm$^{-2}$;
   (e) applying a second insulating layer on the resulting arrangement and providing second windows therein via a photo-lacquer technique so as to provide secondary contacts;
   (f) applying a layer of doped polysilicon and producing third windows therein;
   (g) vapour depositing a layer of aluminium over the resulting structure and lifting-off portions of the aluminium layer not on said secondary contacts;
   (h) applying a further photo-lacquer layer over the entire arrangement and producing fourth windows between spaced apart secondary contacts;
   (i) implanting n-doping ions in said fourth windows with a kinetic energy of about 100 KV and with an implantation dose of about $8 \times 10^{12}$ ions cm$^{-2}$;
   (j) removing remaining portions of said aluminium layer;
   (k) oxidizing said polysilicon layer into an oxide layer;
   (l) producing fifth windows for aluminium contacts;
   (m) vapour depositing a layer of aluminium on the resultant structure;

(n) fixing aluminium paths from said aluminium layer; and (o) applying a protective oxide layer over the resultant structure.

5. A process as defined in claim 1 wherein said ion implantation steps utilized phosphorus and boron ions.

6. A process as defined in claim 4 wherein after application of a doped polysilicon layer in step (f), a damage layer is produced by bombarding the polysilicon layer with relatively low energy particles and process steps (g), (h) and (j) are omitted and step (i) is replaced with a deep implantation process conducted at an energy of about 300 KV.

7. A process as defined in claim 6 wherein said damage layer is produced by particle bombardment carried out with a kinetic energy of about 0.5 to 1 KV and in a dose of about $10^{16}$ particles $cm^{-2}$.

8. A process as defined in claim 6 wherein the polysilicon layer is deposited as an electrically conductive strip for the pulse train electrodes.

* * * * *